(12) United States Patent
Trinh et al.

(10) Patent No.: US 12,408,567 B2
(45) Date of Patent: Sep. 2, 2025

(54) MEMORY DEVICE STRUCTURE WITH DATA STORAGE ELEMENT

(71) Applicant: TAIWAN SEMICONDUCTOR MANUFACTURING COMPANY, LTD., Hsinchu (TW)

(72) Inventors: Hai-Dang Trinh, Hsinchu (TW); Hsing-Lien Lin, Hsinchu (TW); Cheng-Yuan Tsai, Chupei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/358,685

(22) Filed: Jul. 25, 2023

(65) Prior Publication Data

US 2023/0389453 A1 Nov. 30, 2023

Related U.S. Application Data

(60) Continuation of application No. 17/324,328, filed on May 19, 2021, now Pat. No. 11,758,830, which is a continuation of application No. 17/000,537, filed on Aug. 24, 2020, now Pat. No. 11,018,297, which is a division of application No. 15/821,901, filed on Nov. 24, 2017, now Pat. No. 10,804,464.

(51) Int. Cl.
*H10N 70/00* (2023.01)
*H10N 70/20* (2023.01)

(52) U.S. Cl.
CPC ......... *H10N 70/828* (2023.02); *H10N 70/063* (2023.02); *H10N 70/24* (2023.02); *H10N 70/245* (2023.02); *H10N 70/801* (2023.02); *H10N 70/826* (2023.02); *H10N 70/841* (2023.02); *H10N 70/8833* (2023.02)

(58) Field of Classification Search
CPC ... H01L 45/1246; H01L 45/08; H01L 45/085; H01L 45/12; H01L 45/1233; H01L 45/1253; H01L 45/146; H01L 45/1675; H10N 70/828; H10N 70/801; H10N 70/826; H10N 70/8833; H10N 70/841; H10N 70/063; H10N 70/245; H10N 70/24

See application file for complete search history.

(56) References Cited

U.S. PATENT DOCUMENTS

| | | |
|---|---|---|
| 8,686,369 B2 | 4/2014 | Reboni et al. |
| 8,835,890 B2 | 9/2014 | Hsueh et al. |
| 8,981,332 B2 | 3/2015 | Chiang et al. |

(Continued)

FOREIGN PATENT DOCUMENTS

| | | |
|---|---|---|
| KR | 10-2008-0050989 A | 6/2008 |
| KR | 10-2015-0103536 A | 9/2015 |

*Primary Examiner* — Lex H Malsawma
(74) *Attorney, Agent, or Firm* — Birch, Stewart, Kolasch & Birch, LLP

(57) ABSTRACT

A semiconductor device structure is provided. The structure includes a substrate and a data storage element over the substrate. The structure also includes a protective element extending into the data storage element. A bottom surface of the protective element is between a top surface of the data storage element and a bottom surface of the data storage element. The structure further includes a first electrode electrically connected to the data storage element and a second electrode electrically connected to the data storage element.

20 Claims, 11 Drawing Sheets

(56) References Cited

U.S. PATENT DOCUMENTS

| | | |
|---|---|---|
| 9,184,379 B1 | 11/2015 | Wang |
| 11,018,297 B2 | 5/2021 | Trinh et al. |
| 2006/0084247 A1 | 4/2006 | Liu |
| 2009/0278110 A1 | 11/2009 | Gorer et al. |
| 2010/0065803 A1 | 3/2010 | Choi et al. |
| 2010/0102291 A1 | 4/2010 | Xu |
| 2011/0291066 A1 | 12/2011 | Baek et al. |
| 2012/0313063 A1 | 12/2012 | Wang et al. |
| 2014/0001429 A1* | 1/2014 | He ................. H10N 70/826 257/2 |
| 2014/0103284 A1 | 4/2014 | Hsueh et al. |
| 2014/0166969 A1 | 6/2014 | Tendulkar et al. |
| 2015/0028284 A1* | 1/2015 | Gotti ............... H10N 70/8828 257/5 |
| 2015/0090949 A1* | 4/2015 | Chang .............. H10N 70/8265 257/4 |
| 2015/0176122 A1 | 6/2015 | Hsueh et al. |
| 2015/0188043 A1 | 7/2015 | Wang |
| 2015/0249093 A1 | 9/2015 | Lee et al. |
| 2015/0287917 A1 | 10/2015 | Dang et al. |
| 2016/0064664 A1* | 3/2016 | Dang ............... H10N 70/8833 257/4 |
| 2016/0248008 A1 | 8/2016 | Chen et al. |
| 2017/0244031 A1 | 8/2017 | Jeong et al. |
| 2018/0219154 A1 | 8/2018 | Majhi et al. |

\* cited by examiner

MEMORY DEVICE STRUCTURE WITH DATA STORAGE ELEMENT

PRIORITY CLAIM AND CROSS-REFERENCE

This application is a Continuation application of U.S. patent application Ser. No. 17/324,328, filed on May 19, 2021, which is a Continuation application of U.S. patent application Ser. No. 17/000,537, filed on Aug. 24, 2020, which is a Divisional of U.S. application Ser. No. 15/821,901, filed on Nov. 24, 2017, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
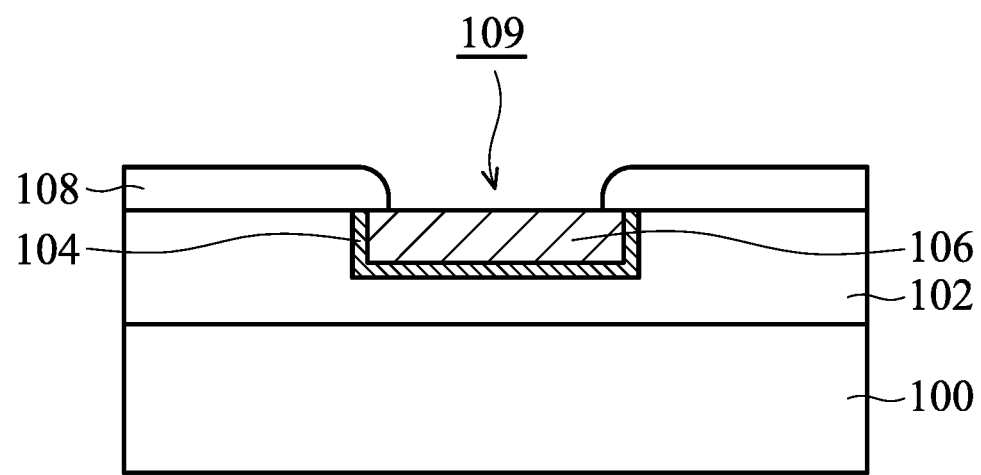
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a semiconductor device structure, in accordance with some embodiments. In some embodiments, the semiconductor device structure to be formed includes a resistive random access memory (RRAM) structure. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers.

The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof.

In some embodiments, multiple conductive features are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes. The device elements in and/or on the semiconductor substrate 100 will be interconnected through the interconnection structure to be formed over the semiconductor substrate 100.

In some embodiments, a conductive feature 106 is formed in the dielectric layer 102, as shown in FIG. 1A. The conductive feature 106 may be a conductive line. In some embodiments, a barrier layer 104 is formed between the conductive feature 106 and the dielectric layer 102. The barrier layer 104 may be used to prevent metal ions of the conductive features 104 from diffusing into the dielectric layer 102.

In some embodiments, trenches are formed in the dielectric layer 102. Each of the trenches may connect a via hole (not shown). The trenches are used to contain conductive lines and the barrier layer. The formation of the trenches may involve photolithography processes and etching processes. Afterwards, the barrier layer 104 is deposited over the dielectric layer 102. The barrier layer 104 extends on sidewalls and bottom portions of the trenches. The barrier layer 104 may be made of or include tantalum nitride, titanium nitride, one or more other suitable materials, or a combination thereof. The barrier layer 104 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive material layer is deposited over the barrier layer 104 to fill the trenches, in accordance with some embodiments. The conductive material layer may be made of or include copper, cobalt, tungsten, titanium, nickel, gold, platinum, graphene, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, the barrier layer 104 and the conductive material layer outside of the trenches are removed, in accordance with some embodiments. Remaining portions of the conductive material layer in one of the trenches form the conductive feature 106. In some embodiments, the barrier layer 104 and the conductive material layer outside of the trenches are removed using a planarization process. The planarization process may include a CMP process, a dry polishing process, a mechanical grinding process, an etching process, one or more other applicable processes, or a combination thereof.

As shown in FIG. 1A, a dielectric layer 108 is deposited over the dielectric layer 102 and the conductive feature 106, in accordance with some embodiments. The dielectric layer 108 may be made of or include silicon carbide (SiC), nitrogen-doped silicon carbide, oxygen-doped silicon carbide, silicon nitride (SiN), silicon oxynitride (SiON), silicon oxide, one or more other suitable materials, or a combination thereof. The dielectric layer 108 may be deposited using a CVD process, an ALD process, a PVD process, one or more other applicable processes, or a combination thereof. In some embodiments, the dielectric layer 108 is patterned to form an opening 109 that exposes the conductive feature 106, as shown in FIG. 1A.

Figure 1B:
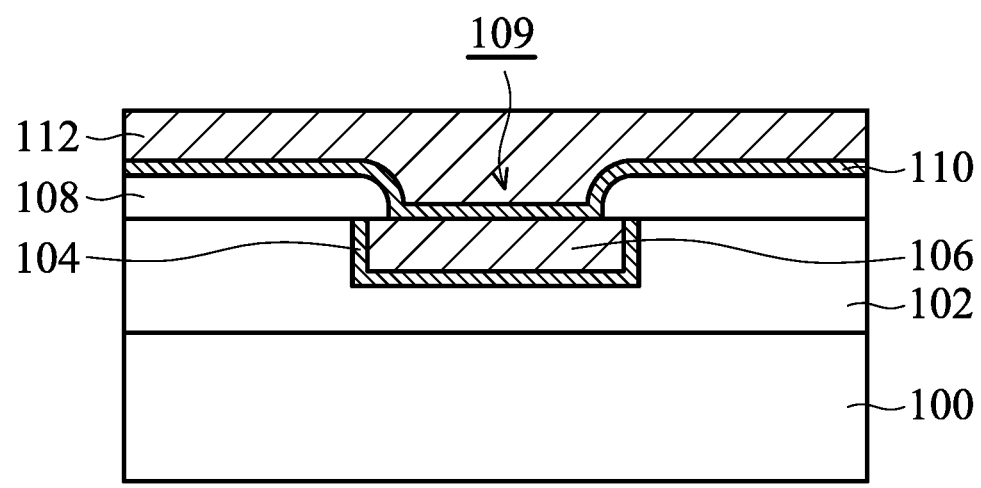

As shown in FIG. 1B, a barrier layer 110 is deposited over the dielectric layer 108, in accordance with some embodiments. The barrier layer 110 extends on the sidewalls and bottom portion of the opening 109. The barrier layer 110 may be made of or include tantalum nitride, titanium nitride, one or more other suitable materials, or a combination thereof. The barrier layer 110 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive layer 112 is deposited over the barrier layer 110, as shown in FIG. 1B in accordance with some embodiments. The conductive layer 112 may fill the opening 109. The conductive layer 112 is used as a lower electrode layer of a memory device that will be formed. The conductive layer 112 may be made of or include copper, cobalt, tungsten, titanium, nickel, gold, platinum, graphene, one or more other suitable materials, or a combination thereof. The conductive layer 112 may be deposited using a CVD process, an ALD process, a PVD process, an electroplating process, an electroless plating process, one or more other applicable processes, or a combination thereof.

In some embodiments, the conductive layer 112 is planarized to provide the conductive layer 112 with a substantially planarized surface, which may facilitate subsequent formation processes. The conductive layer 112 may be planarized using a chemical mechanical polishing (CMP) process, a grinding process, a dry polishing process, an etching process, one or more other applicable processes, or a combination thereof.

Figure 1C:
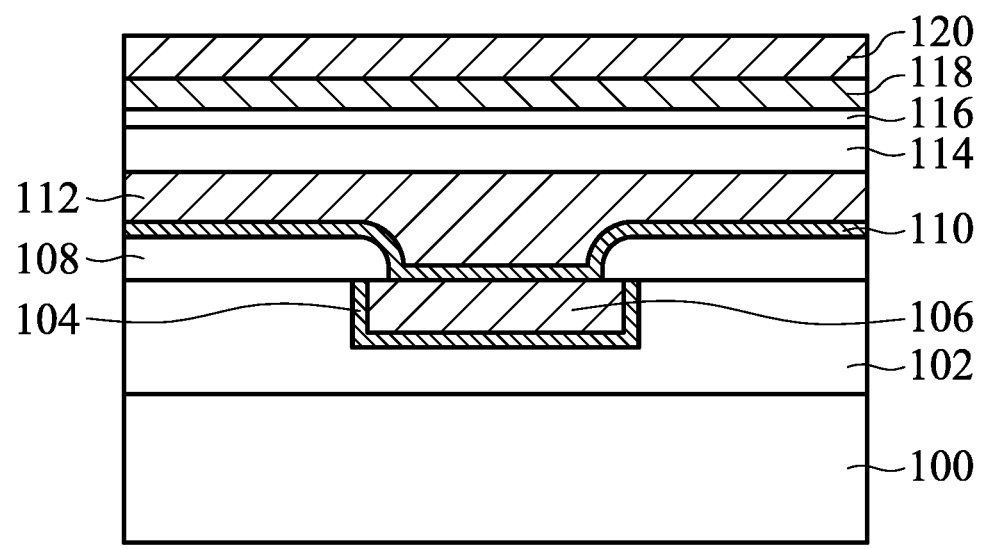

As shown in FIG. 1C, a data storage layer 114 is deposited over the conductive layer 112, in accordance with some embodiments. The data storage layer 114 is configured to store data unit. In some embodiments, the data storage layer 114 is a resistance variable layer which has a variable resistance representing the data unit. Depending upon the voltage applied across the data storage layer 114, the variable resistance can be changed between different resistance states corresponding to different data states of the data unit.

The data storage layer 114 may have reduced resistance after a sufficiently high voltage is applied to the data storage layer 114. The applied voltage may induce ions (such as oxygen ions and/or nitrogen ions) in the data storage layer 114 to move to the electrodes. As a result, a series of vacancies are formed in the data storage layer 114. These vacancies may together form one or more conductive paths. For example, through a forming process, one or more conductive paths (for example, conductive filaments) may be formed in the data storage layer 114 so that the resistance of the data storage layer 114 is reduced significantly.

A reverse voltage may be applied to partially destroy the formed conductive filaments or the conductive paths. As a result, the resistance of the data storage layer 114 is increased. Therefore, the resistance of the data storage layer 114 may be adjusted through the application of voltage. The data may be stored in the data storage layer 114. By detecting the current passing through the data storage layer 114, information about the resistance of the data storage layer 114 is obtained. Therefore, the stored data is also obtained correspondingly.

In some embodiments, the data storage layer 114 is made of a dielectric material and is usually electrically insulating. The data storage layer 114 may be made of or include a metal oxide, a metal nitride, or a combination thereof. In some embodiments, the data storage layer 114 is made of an oxygen-containing dielectric material. In some embodiments, the material of the data storage layer 114 includes hafnium oxide, aluminum oxide, tantalum oxide, zirconium oxide, hafnium aluminum oxide, one or more other suitable materials, or a combination thereof. In some embodiments, the data storage layer 114 has a thickness that is in a range from about 5 Å to about 100 Å.

Many methods may be used to form the data storage layer 114. In some embodiments, the data storage layer 114 is deposited using an ALD process, a CVD process, a PVD process, a spin-on process, a spraying coating process, one or more other applicable processes, or a combination thereof.

In some embodiments, the data storage layer 114 is in direct contact with the conductive layer 112 which serves as a lower electrode layer. In some embodiments, due to the substantially planar surface provided by the planarized conductive layer 112, adhesion between the data storage layer 114 and the conductive layer 112 is improved.

Afterwards, an ion diffusion barrier layer 116 is deposited over the data storage layer 114, as shown in FIG. 1C in accordance with some embodiments. In some embodiments, the ion diffusion barrier layer 116 is configured to prevent or slow material from diffusing from and/or into the data storage layer 114. In some embodiments, the ion diffusion barrier layer 116 is used to slow oxygen ions from diffusing from and/or into the data storage layer 114. In some embodiments, the ion diffusion barrier layer 116 is formed directly on the data storage layer 114. In these cases, the ion diffusion barrier layer 116 is in direct contact with the data storage layer 114.

In some embodiments, the ion diffusion barrier layer 116 is made of a metal material doped with nitrogen, carbon, or a combination thereof. The metal material mentioned above may include titanium (Ti), tungsten (W), hafnium (Hf), zirconium (Zr), tantalum (Ta), aluminum (Al), lanthanum (La), one or more other suitable or similar metal materials, or a combination thereof. For example, the ion diffusion barrier layer 116 is made of or includes nitrogen-doped titanium, nitrogen-doped tantalum, carbon-doped titanium, carbon-doped tantalum, one or more other suitable metal materials doped with nitrogen and/or carbon, or a combination thereof.

In some embodiments, the ion diffusion barrier layer 116 is formed to have an appropriate atomic concentration of nitrogen or carbon that is in a range from about 10% to about 45%. In some cases, if the atomic concentration of nitrogen or carbon is smaller than about 10%, the ion diffusion barrier layer 116 may not have sufficient barrier ability. In some other cases, if the atomic concentration of nitrogen or carbon is greater than about 45%, the ion diffusion barrier layer 116 may have barrier ability that is too strong. As a result, ions such as oxygen ions may not be able to diffuse from and/or into the data storage layer 114.

However, many variations and/or modifications may be made to embodiments of the disclosure. The ion diffusion barrier layer 116 may have a different atomic concentration of nitrogen or carbon. In some other embodiments, the ion diffusion barrier layer 116 is formed to have an atomic concentration of nitrogen or carbon that is in a range from about 20% to about 35%.

In some embodiments, the ion diffusion barrier layer 116 is formed to have an appropriate thickness that is in a range from about 5 Å to about 70 Å. In some cases, if the thickness of the ion diffusion barrier layer 116 is smaller than about 5 Å, the ion diffusion barrier layer 116 may not have sufficient barrier ability. In some other cases, if the thickness of the ion diffusion barrier layer 116 is greater than about 70 Å, the ion diffusion barrier layer 116 may have barrier ability that is too strong. As a result, ions such as oxygen ions may not be able to diffuse from and/or into the data storage layer 114.

However, many variations and/or modifications may be made to embodiments of the disclosure. The ion diffusion barrier layer 116 may have a different thickness. In some other embodiments, the ion diffusion barrier layer 116 is formed to have a thickness that is in a range from about 15 Å to about 50 Å.

In some embodiments, the ion diffusion barrier layer 116 is deposited using an ALD process, a CVD process, a PVD process, one or more other applicable processes, or a combination thereof. In some embodiments, the deposition of the ion diffusion barrier layer 116 involves the usage of a metal-containing gas and a dopant-containing gas. The dopant-containing gas may be or include a nitrogen-containing gas, a carbon-containing gas, one or more other suitable gases, or a combination thereof.

Many variations and/or modifications can be made to embodiments of the disclosure. In some other embodiments, a metal layer is deposited over the data storage layer 114. Afterwards, an ion implantation process is used to dope the metal layer with nitrogen and/or carbon. As a result, the ion diffusion barrier layer 116 made of a metal material doped with nitrogen and/or carbon is formed.

As shown in FIG. 1C, a capping layer 118 is afterwards deposited over the ion diffusion barrier layer 116, in accordance with some embodiments. In some embodiments, the capping layer 118 is used as an ion reservoir region. The capping layer 118 may induce the formation of vacancies in the data storage layer 114 during subsequent forming process and/or setting process. For example, the capping layer 118 is used to receive oxygen ions from the data storage layer 114. As a result, vacancies forming the conductive paths or conductive filaments are formed in the data storage layer 114. The forming and/or setting processes may therefore be achieved.

In some embodiments, the capping layer 118 is thicker than the ion diffusion barrier layer. In some embodiments, the capping layer 118 is formed to have an appropriate thickness that is in a range from about 10 Å to about 150 Å. In some cases, if the thickness of the capping layer 118 is smaller than about 10 Å, the capping layer 118 may not be able to contain a sufficient amount of oxygen ions from the data storage layer 114. As a result, the forming and/or setting processes may not be easy to perform. In some other cases, if the thickness of the capping layer 118 is greater than about 150 Å, the operation speed for the reset process may be slowed down. In some embodiments, the ratio of the thickness of the ion diffusion barrier layer 116 to the thickness of the capping layer 118 is in a range from about 0.02 to about 0.2.

In some embodiments, the capping layer 118 is made of a metal material. In some embodiments, the capping layer 118 is made of or includes titanium (Ti), hafnium (Hf), zirconium (Zr), lanthanum (La), tantalum (Ta), nickel (Ni), tungsten (W), one or more other suitable metal materials, or a combination thereof. In some embodiments, the capping layer 118 is made of a pure metal material or a combination of pure metal materials. In some embodiments, the capping layer 118 includes substantially no nitrogen or carbon. In some embodiments, the capping layer 118 is deposited using a PVD process, a CVD process, an ALD process, a plating process, one or more other applicable processes, or a combination thereof.

Afterwards, a conductive layer 120 is deposited over the capping layer 118, as shown in FIG. 1C in accordance with some embodiments. The conductive layer 120 is used as an upper electrode layer of a memory device that will be formed. The conductive layer 120 may be made of or include copper, cobalt, tungsten, titanium, nickel, gold, platinum, graphene, one or more other suitable materials, or a combination thereof. The conductive layer 120 may be deposited using a CVD process, an ALD process, a PVD process, an electroplating process, an electroless plating process, one or more other applicable processes, or a combination thereof.

Figure 1D:
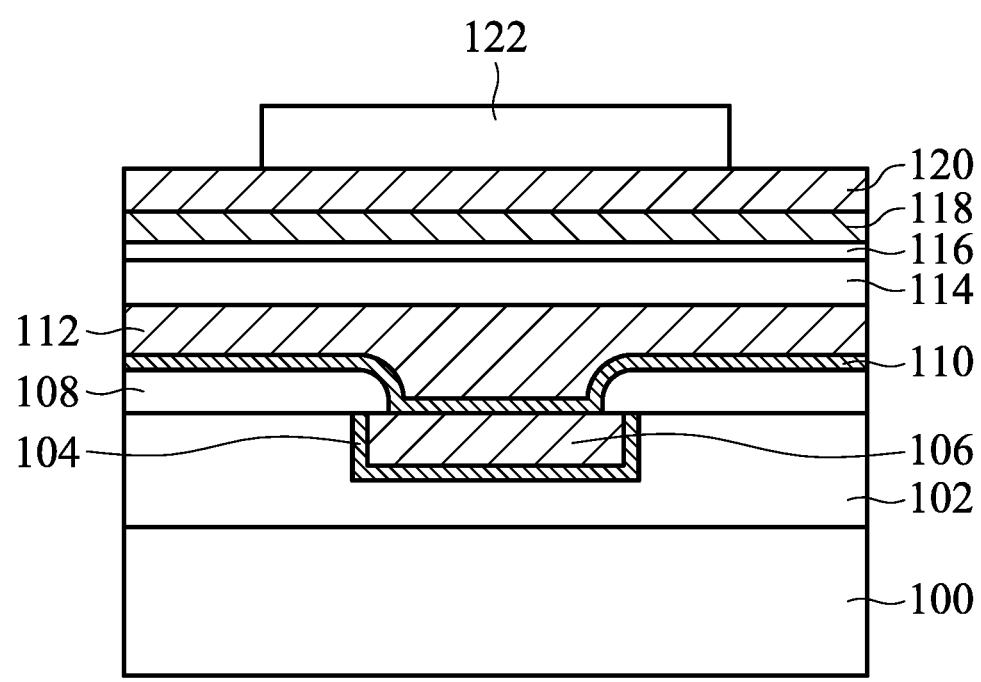

As shown in FIG. 1D, a mask element 122 is formed over the conductive layer 120, in accordance with some embodiments. The mask element 122 is used to assist in subsequent patterning process of the conductive layer 120, the capping layer 118, and the ion diffusion barrier layer 116. The mask element 122 may be made of or include silicon nitride, silicon oxynitride, silicon oxide, one or more other suitable materials, or a combination thereof. A photolithography process and an etching process may be used to form the mask element 122.

Many variations and/or modifications can be made to embodiments of the disclosure. In some other embodiments, the mask element 122 is not formed.

Figure 1E:
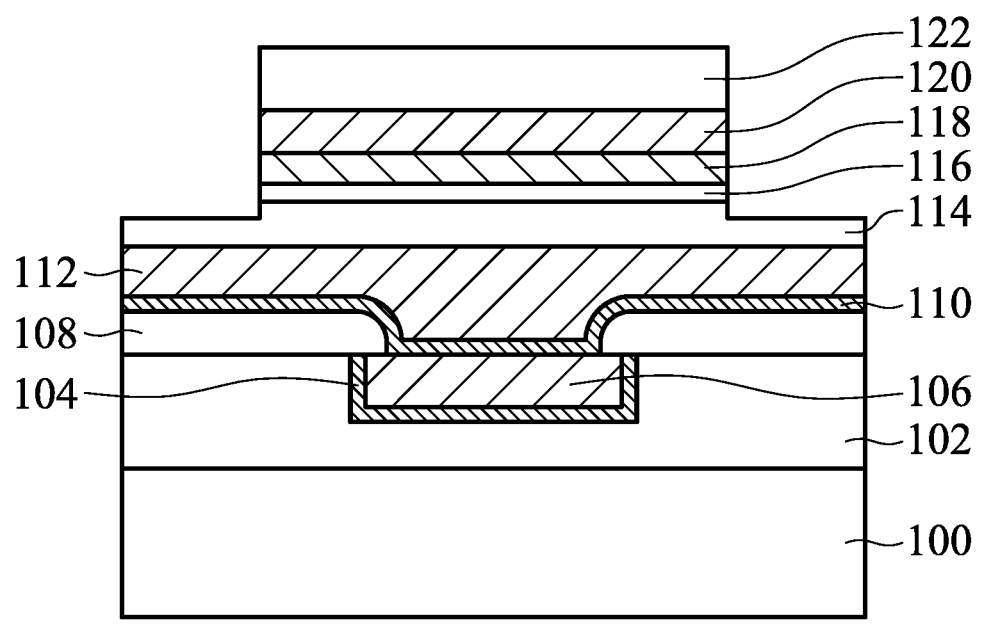

As shown in FIG. 1E, the conductive layer 120, the capping layer 118, and the ion diffusion barrier layer 116 are partially removed to be patterned, in accordance with some embodiments. After the patterning processes, the data storage layer 114 is exposed. In some embodiments, the conductive layer 120, the capping layer 118, and the ion diffusion barrier layer 116 are partially removed using one or more etching processes. In some embodiments, the data storage layer 114 is partially removed during the patterning of the conductive layer 120, the capping layer 118, and the ion diffusion barrier layer 116.

Figure 1F:
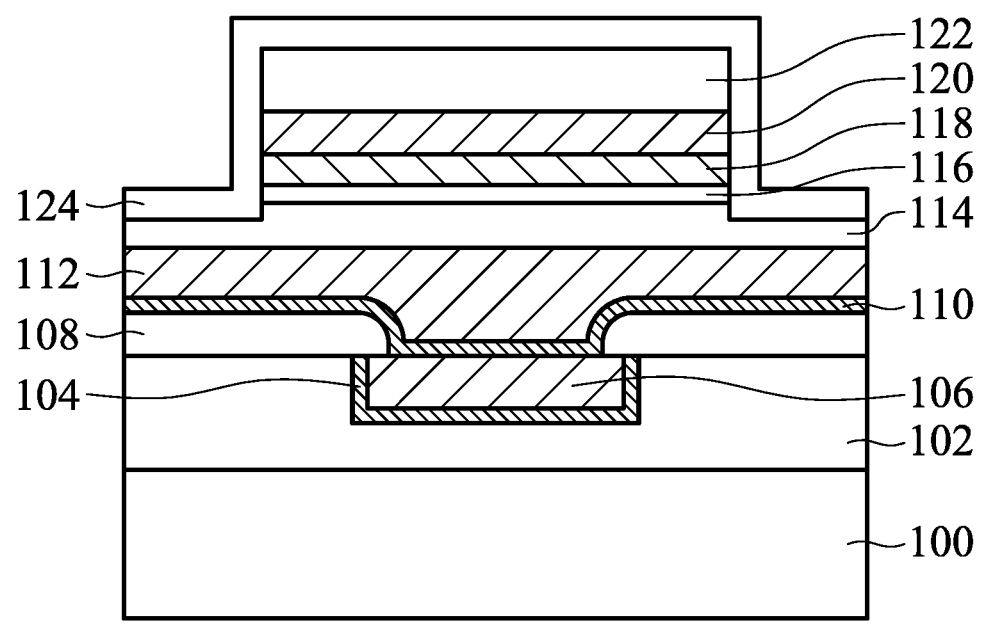

As shown in FIG. 1F, a protective layer 124 is deposited over the structure shown in FIG. 1E, in accordance with some embodiments. The protective layer 124 may be made of or include silicon nitride, silicon oxynitride, silicon oxide, one or more other suitable materials, or a combination thereof. In some embodiments, the protective layer 124 is deposited using a CVD process, an ALD process, a spin-on process, a PVD process, one or more other applicable processes, or a combination thereof.

Figure 1G:
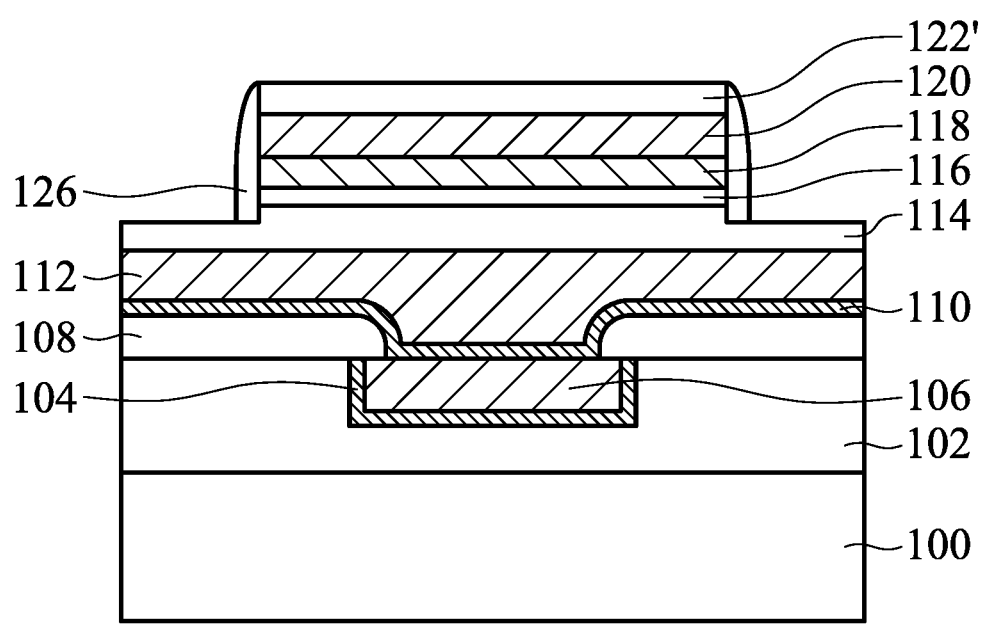

As shown in FIG. 1G, the protective layer 124 is partially removed to form a protective element 126, in accordance with some embodiments. The protective element 126 covers sidewalls of the conductive layer 120, the capping layer 118, and the ion diffusion barrier layer 116. An etching process may be used to form the protective element 126. During the etching process, the mask element 122 may also be etched. As a result, a mask element 122' with a smaller thickness may be formed.

Many variations and/or modifications can be made to embodiments of the disclosure. In some other embodiments, the protective layer 124 or the protective element 126 is not formed.

Figure 1H:
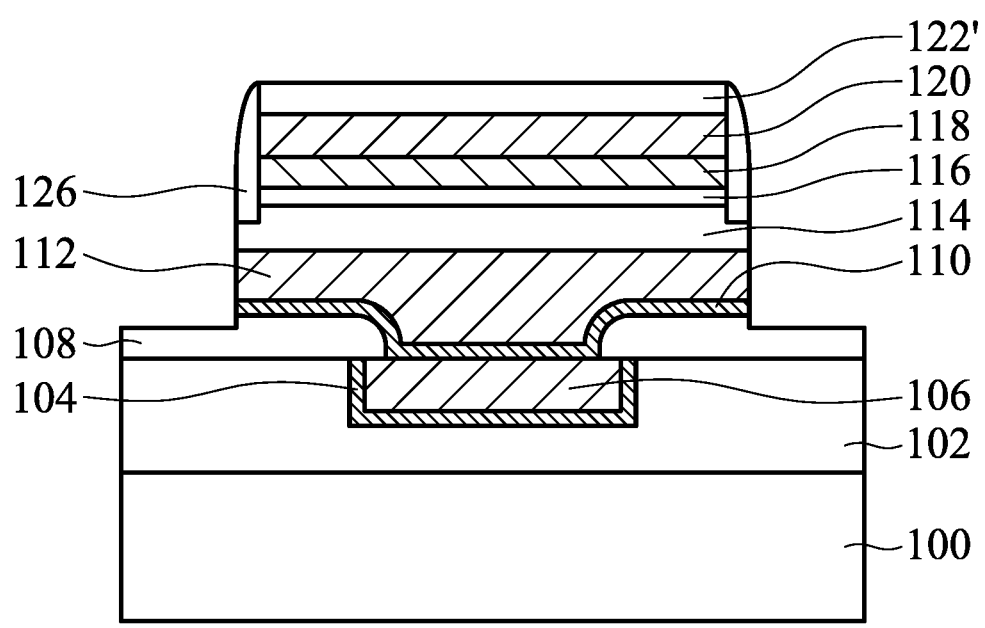

As shown in FIG. 1H, the data storage layer 114, the conductive layer 112, and the barrier layer 110 are partially removed to be patterned, in accordance with some embodiments. In some embodiments, the data storage layer 114, the conductive layer 112, and the barrier layer 110 are partially removed using one or more etching processes. The protective element 126 and the mask element 122' may together function as an etching mask during the patterning of the data storage layer 114, the conductive layer 112, and the barrier layer 110.

Figure 1I:
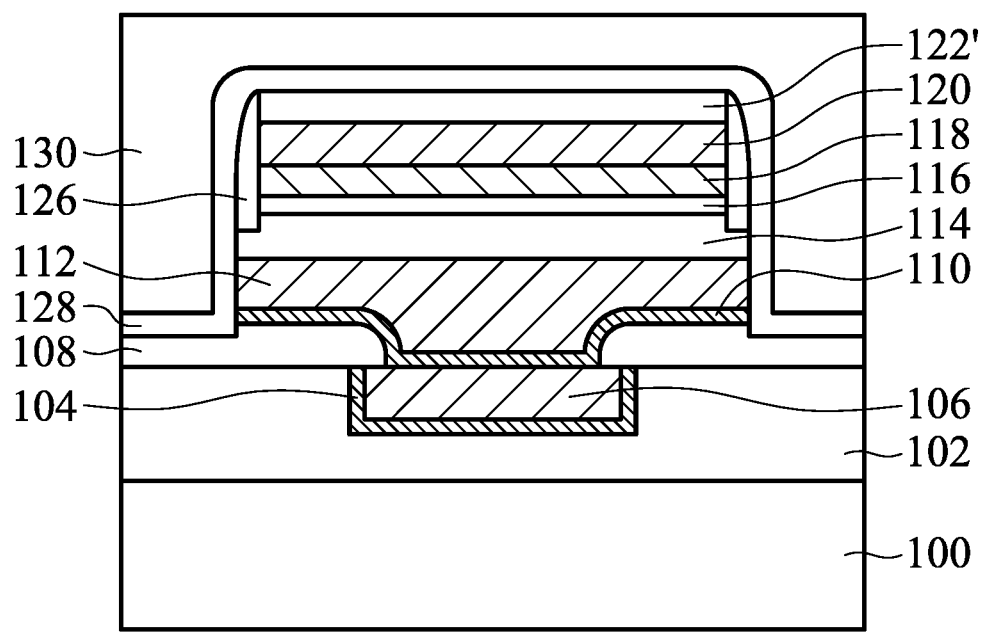

As shown in FIG. 1I, a protective layer 128 is deposited over the structure shown in FIG. 1H, in accordance with some embodiments. In some embodiments, the protective layer 128 contains silicon, oxygen, and/or carbon. The protective layer 128 may be made of or include silicon oxide, silicon nitride, silicon carbide, silicon oxynitride, one or more other suitable materials, or a combination thereof. In some embodiments, the protective layer 128 is made of a material that is substantially free of oxygen. In some embodiments, the protective layer 128 is a single layer. In some other embodiments, the protective layer 128 includes multiple sub-layers. The sub-layers may be made of the same material. Alternatively, some of the sub-layers are made of different materials. The protective layer 128 may be deposited using a CVD process, an ALD process, a PVD process, a spin-on process, one or more other applicable processes, or a combination thereof.

Afterwards, a dielectric layer 130 is deposited over the protective layer 128, as shown in FIG. 1I in accordance with some embodiments. The dielectric layer 130 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. The dielectric layer 130 may be deposited using a CVD process, an ALD process, a PVD process, a spin-on process, a spray coating process, one or more other applicable processes, or a combination thereof.

Figure 1J:
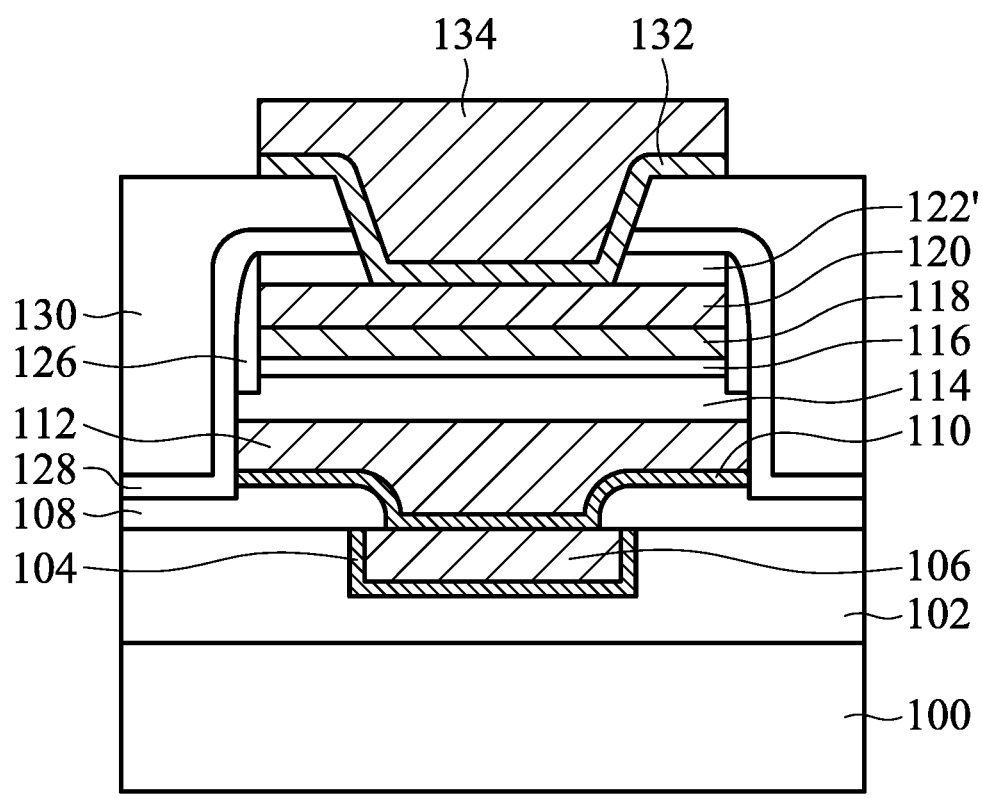

As shown in FIG. 1J, a conductive feature 134 is formed in the dielectric layer 130, in accordance with some embodiments. The conductive feature 134 is electrically connected to the conductive layer 120. In some embodiments, the conductive feature 134 is a conductive via. In some embodiments, the conductive feature 134 is a conductive line. In some embodiments, the conductive feature 134 is a combination of a conductive via and a conductive line which is formed using a dual damascene process.

In some embodiments, a barrier layer 132 is formed before the formation of the conductive feature 134. The material and formation method of the barrier layer 132 may be the same as or similar to those of the barrier layer 104. The material and formation method of the conductive feature 134 may be the same as or similar to those of the conductive feature 106.

As shown in FIG. 1J, a semiconductor device with a resistive random access memory (RRAM) structure is formed, in accordance with some embodiments. The conductive layers 112 and 120 serve as a lower electrode and an upper electrode, respectively. The conductive layers 112 and 120 sandwich the data storage layer 114, the ion diffusion barrier layer 116, and the capping layer 118. The RRAM structure employs oxygen vacancies to manipulate the resistance of the data storage layer 114. When a set voltage is applied across the conductive layers 112 and 120, ions such as oxygen ions in the data storage layer 114 move through the ion diffusion barrier layer 116 to the capping layer 118, thereby re-forming conductive paths (initially formed by a form voltage) from oxygen vacancies and switching the variable resistance to the low resistance state. The set voltage is, for example, a positive voltage. When a reset voltage is applied across the conductive layers 120 and 112, the ions such as oxygen ions move back to the data storage layer 114 through the ion diffusion barrier layer 116, thereby filling the oxygen vacancies and switching the variable resistance to the high resistance state. The reset voltage is, for example, a negative voltage.

Ion diffusion is a challenge for RRAM structure at high operating temperatures or under repeated operations. For example, under the high resistance state, the oxygen ions may slowly diffuse back to the capping layer 116 due to concentration gradient. As a result, the conductive filaments or the conductive paths may be formed again, which decreases resistance of the data storage layer 114. Alternatively, under the low resistance state, the oxygen ions may slowly diffuse back to the data storage layer 114. As a result, the conductive filaments or the conductive paths may be partially destroyed, which increases resistance of the data storage layer 114. As the diffusion occurs, the variable resistance either increases or decreases eventually toggling the state of the variable resistance between the high and low resistivity states. This undesirably changes the state of the data unit represented by the variable resistance, thereby resulting in data corruption and reduced data retention.

In some embodiments, because of the ion diffusion barrier layer 116 formed between the data storage layer 114 and the capping layer 118, the undesired ion diffusion is prevented or slowed down. For example, under the high resistance state, the oxygen ions are prevented from diffusing back to the capping layer 118 from the data storage layer 114 due to the ion diffusion barrier layer 116. Therefore, there is substantially no undesired conductive filament formed in the data storage layer 114. The data storage layer 114 may still be under the high resistance state. For example, under the low resistance state, the oxygen ions are prevented from diffusing back to the data storage layer 114 from the capping layer 118 due to the ion diffusion barrier layer 116. Therefore, the conductive filaments in the data storage layer 114 are prevented from being damaged since oxygen ions are blocked. The data storage layer 114 may still be under the low resistance state. The performance, retention, and reliability of the RRAM structure are improved. In some embodiments, the switching window is improved by about 1.5 times to about 2.5 times, when compared with other embodiments without the ion diffusion barrier layer 116.

Figure 2:
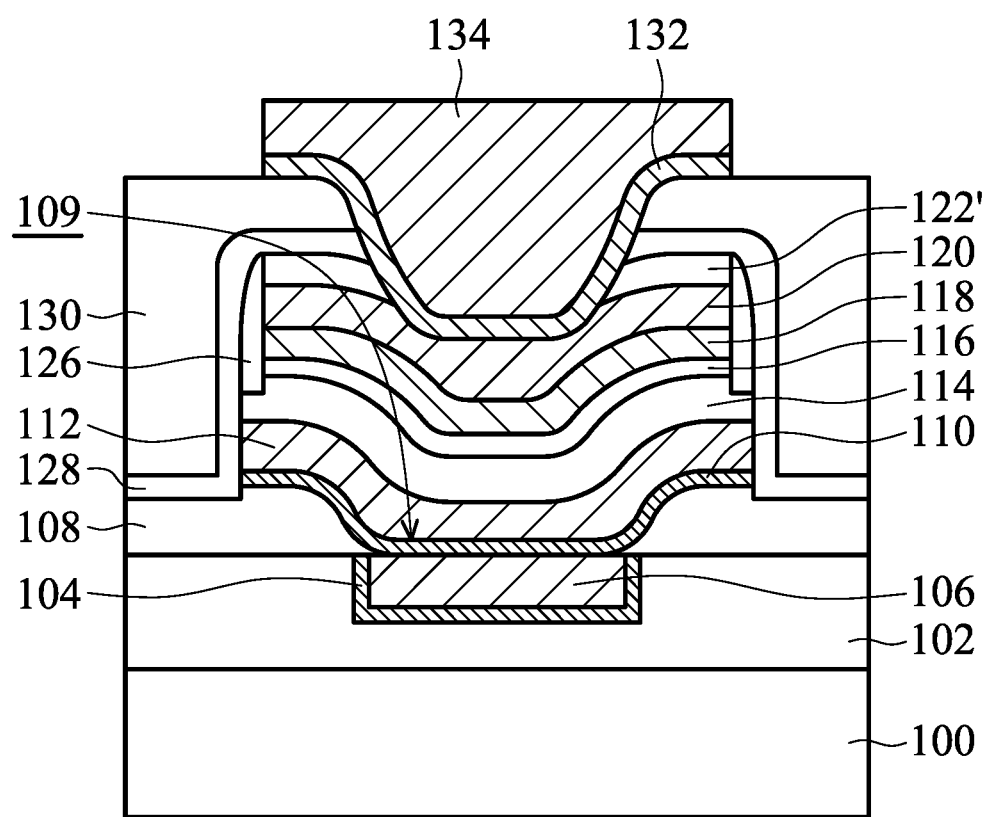
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. In some embodiments, a structure the same as or similar to that shown in FIG. 1A is provided or received. In some embodiments, before the lower electrode layer (such as the conductive layer 112) is formed, the dielectric layer 108 is formed over the semiconductor substrate 100. Afterwards, the opening 109 is formed in the dielectric layer 108. In some embodiments, the barrier layer 110 and the conductive layer 112 are formed. Portions of the barrier layer 110 and the conductive layer 112 extends into the opening 109. In some embodiments, the conductive layer 112 is not planarized. Therefore, the conductive layer 112 includes a curved upper surface. In some embodiments, the subsequently formed layers 114, 116, 118, and 120 also include curved upper surfaces accordingly, as shown in FIG. 2.

Embodiments of the disclosure form a semiconductor device including a resistive random access memory (RRAM) structure. The RRAM structure includes a data storage layer and a capping layer which are sandwiched between a lower electrode and an upper electrode. An ion diffusion barrier layer made of a metal material doped with nitrogen and/or carbon is formed between the data storage layer and the capping layer. The ion diffusion barrier layer may be used to prevent undesired ion diffusion between the data storage layer and the capping layer. Therefore, the quality and reliability of the semiconductor device structure are significantly improved.

In accordance with some embodiments, a method for forming a semiconductor device structure is provided. The method includes forming a lower electrode layer over a semiconductor substrate and forming a data storage layer over the lower electrode layer. The method also includes forming an ion diffusion barrier layer over the data storage layer and forming a capping layer over the ion diffusion barrier layer. The ion diffusion barrier layer is a metal material doped with nitrogen, carbon, or a combination thereof. The capping layer is made of a metal material. The method further includes forming an upper electrode layer over the capping layer.

In accordance with some embodiments, a method for forming a semiconductor device structure is provided. The method includes forming a lower electrode layer over a semiconductor substrate and forming a resistance variable layer over the lower electrode layer. The method also includes forming a barrier layer over the resistance variable layer and forming a capping layer over the barrier layer. The capping layer is made of a metal material, and the capping layer is in direct contact with the barrier layer. The method further includes forming an upper electrode layer over the capping layer.

In accordance with some embodiments, a semiconductor device structure is provided. The semiconductor device structure includes a semiconductor substrate and a lower electrode over the semiconductor substrate. The semiconductor device structure also includes a resistance variable layer over the lower electrode and an ion diffusion barrier layer over the resistance variable layer. The ion diffusion barrier layer is a metal material doped with nitrogen or carbon. The semiconductor device structure further includes a capping layer over the ion diffusion barrier layer, and the capping layer is made of a metal material. In addition, the semiconductor device structure includes an upper electrode over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a substrate;
a data storage element over the substrate;
a protective element extending into the data storage element, wherein a bottom surface of the protective element is between a top surface of the data storage element and a bottom surface of the data storage element;
a first electrode electrically connected to the data storage element;
a second electrode electrically connected to the data storage element;
an ion diffusion barrier layer between the data storage element and the second electrode, wherein the ion diffusion barrier layer is spaced apart from the second electrode, and the protective element extends across opposite surfaces of the ion diffusion barrier layer; and
a metal capping element between the ion diffusion barrier layer and the second electrode, wherein the protective element extends upwards along sidewalls of the data storage element, the ion diffusion barrier layer, the metal capping element, and the second electrode to reach a height level higher than a topmost surface of the second electrode.

2. The semiconductor device structure as claimed in claim 1, wherein the data storage element is made of an oxygen-containing dielectric material.

3. The semiconductor device structure as claimed in claim 1, wherein the ion diffusion barrier element is a metal material doped with nitrogen.

4. The semiconductor device structure as claimed in claim 1, wherein the ion diffusion barrier layer is a metal material doped with carbon.

5. The semiconductor device structure as claimed in claim 1, wherein a lower portion of the data storage element is wider than an upper portion of the data storage element.

6. The semiconductor device structure as claimed in claim 5, wherein the data storage element has a surface connecting a first sidewall of the lower portion and a second sidewall of the upper portion, and slopes of the surface and the first sidewall are different from each other.

7. The semiconductor device structure as claimed in claim 1, wherein the protective element has an inner edge and an outer edge, the inner edge is between the outer edge and the data storage element, and the outer edge is substantially aligned with an edge of the first electrode.

8. The semiconductor device structure as claimed in claim 1, wherein the metal capping element comprises titanium, hafnium, zirconium, tantalum, nickel, or tungsten.

9. The semiconductor device structure as claimed in claim 1, wherein the ion diffusion barrier layer has a first thickness, the metal capping element has a second thickness, and a ratio of the first thickness to the second thickness is in a range from about 0.02 to about 0.2.

10. The semiconductor device structure as claimed in claim 1, further comprising:
a conductive feature electrically connected to the second electrode, wherein a bottommost surface of the conductive feature is vertically between the topmost surface of the second electrode and a top of the protective element.

11. A semiconductor device structure, comprising:
a substrate;
a data storage element over the substrate, wherein the data storage element has a lower portion and an upper portion, the data storage element has a surface connecting a first sidewall of the lower portion and a second sidewall of the upper portion, the first sidewall and the surface have different slopes, and the second sidewall and the surface have different slopes;
a first electrode electrically connected to the data storage element;
a second electrode electrically connected to the data storage element;
an ion diffusion barrier layer between the data storage element and the second electrode, wherein the ion diffusion barrier layer is spaced apart from the second electrode by a metal layer; and
a protective element extending upwards from the surface of the data storage element to a height level above a top of the ion diffusion barrier layer and a topmost surface of the second electrode, wherein the protective element extends along a sidewall of the ion diffusion barrier layer.

12. The semiconductor device structure as claimed in claim 11, wherein the lower portion is wider than the upper portion.

13. The semiconductor device structure as claimed in claim 11, wherein the first electrode is wider than the second electrode.

14. The semiconductor device structure as claimed in claim 11, wherein the protective element is in contact with the surface and the second sidewall of the data storage element.

15. The semiconductor device structure as claimed in claim 11, further comprising:
a protective layer extending along edges of the first electrode, the data storage element, and the protective element, wherein the protective layer is spaced apart from the second electrode; and
a dielectric layer covering the protective layer.

16. A semiconductor device structure, comprising:
a substrate;
a lower electrode over the substrate;
a resistance variable element over the lower electrode, wherein the resistance variable element has a lower portion and an upper portion, the lower portion is wider than the upper portion, and the lower portion laterally protrudes from an edge of the upper portion;
an upper electrode over the resistance variable element;
an ion diffusion barrier layer between the resistance variable element and the upper electrode, wherein the ion diffusion barrier layer is spaced apart from the upper electrode by a capping layer;
a protective element extending upwards from a first top of the lower portion of the resistance variable element to surpass a second top of the upper portion of the resistance variable element;
a dielectric layer covering the protective element and the upper electrode; and
a conductive feature laterally extending over a top of the dielectric layer and extending into the dielectric layer to be electrically connected to the upper electrode, wherein a top of the protective element is between a topmost surface of the upper electrode and a top of the conductive feature.

17. The semiconductor device structure as claimed in claim 16, wherein the protective element extends along edges of the resistance variable element and the upper electrode, and the protective element gradually shrinks along a direction from a bottom of the protective element towards the top of the protective element.

18. The semiconductor device structure as claimed in claim 16, wherein the protective element is in direct contact with the resistance variable element.

19. The semiconductor device structure as claimed in claim 16, wherein the lower portion of the resistance variable element is as wide as the lower electrode, and the upper portion of the resistance variable element is as wide as the upper electrode.

20. The semiconductor device structure as claimed in claim 16, wherein a bottommost surface of the resistance variable element is closer to the substrate than a topmost surface of the lower electrode.

\* \* \* \* \*